(12) United States Patent
Huber et al.

(10) Patent No.: US 10,145,912 B2
(45) Date of Patent: Dec. 4, 2018

(54) DETUNING A MRT RECEIVE ANTENNA

(71) Applicants: Klaus Huber, Effeltrich (DE); Robert Rehner, Neunkirchen am Brand (DE); Markus Vester, Nürnberg (DE)

(72) Inventors: Klaus Huber, Effeltrich (DE); Robert Rehner, Neunkirchen am Brand (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 305 days.

(21) Appl. No.: 15/131,201

(22) Filed: Apr. 18, 2016

(65) Prior Publication Data

US 2016/0320465 A1 Nov. 3, 2016

(30) Foreign Application Priority Data

Apr. 30, 2015 (DE) .................. 10 2015 207 990

(51) Int. Cl.
*G01R 33/36* (2006.01)
*G01R 33/341* (2006.01)

(52) U.S. Cl.
CPC ........ *G01R 33/3657* (2013.01); *G01R 33/341* (2013.01)

(58) Field of Classification Search
CPC ................ G01R 33/3657; G01R 33/341
USPC .................................. 324/322, 309
See application file for complete search history.

(56) References Cited

U.S. PATENT DOCUMENTS

| 6,414,488 | B1 * | 7/2002 | Chmielewski | G01R 33/3657 324/311 |
| 6,747,452 | B1 * | 6/2004 | Jectic | G01R 33/3657 324/311 |
| 8,013,609 | B2 * | 9/2011 | Vartiovaara | G01R 33/3657 324/318 |

(Continued)

FOREIGN PATENT DOCUMENTS

DE 10356274 B4 6/2007

OTHER PUBLICATIONS

"EPC8004—Enhancement Mode Power Transistor", eGaN FET Datasheet, EPC-Efficient Power Conversion Corporation, www.epc-co.com, pp. 1-6, 2014.

*Primary Examiner* — Reena Aurora
(74) *Attorney, Agent, or Firm* — Lampia Summerfield Katz LLC

(57) ABSTRACT

An arrangement for detuning a receive antenna, a detunable magnetic resonance coil, and a magnetic resonance device having a detunable magnetic resonance coil are provided. The arrangement includes a receive antenna having at least one first capacitance, wherein radiofrequency signals from a magnetic resonance examination may be received by way of the receive antenna. The arrangement furthermore includes a switchable detuning circuit containing the first capacitance switched to form an oscillating circuit and a first inductance, and a switching device having a first and a second connection point to deliver a voltage between the first and a second connection point, and one or more transistors. The switching device switches the oscillating circuit to a high impedance level with aid of the one or more transistors on delivery of a positive voltage to the first connection point, preventing a radiofrequency signal from being received by way of the receive antenna.

18 Claims, 5 Drawing Sheets

(56) References Cited

U.S. PATENT DOCUMENTS

| | | | |
|---|---|---|---|
| 9,720,060 B2 * | 8/2017 | Reykowski | G01R 33/3628 |
| 9,933,501 B2 * | 4/2018 | Yang | G01R 33/3657 |
| 2005/0134277 A1 | 6/2005 | Matschl et al. | |
| 2014/0312902 A1 * | 10/2014 | Tan | G01R 33/3657 |
| | | | 324/322 |

* cited by examiner

DETUNING A MRT RECEIVE ANTENNA

This application claims the benefit of DE 10 2015 207 990.2, filed on Apr. 30, 2015, which is hereby incorporated by reference in its entirety.

TECHNICAL FIELD

The embodiments relate to an arrangement for detuning a receive antenna, a detunable magnetic resonance coil, and a magnetic resonance device having at least one detunable magnetic resonance coil.

BACKGROUND

Imaging methods represent important tools in medical technology. Magnetic resonance tomography (MRT) is distinguished in the field of clinical sectional imaging by high and variable soft-tissue contrasts. A magnetic resonance device may include one or more antennas that may be used in order to send and receive radiofrequency electromagnetic signals. Local receive antennas are detuned during the send phase of the MRT examination. Otherwise, high radiofrequency electrical currents may be induced in said local receive antennas, which on the one hand may disrupt the homogeneity of the excitation and on the other hand may endanger any patient and/or damage the receive electronics.

Hitherto, PIN diodes (positive intrinsic negative diodes) have been used for detuning, by which an inductance or coil is switched parallel to a capacitance or capacitor situated in an antenna circuit. The inductance is dimensioned such that, together with the capacitance, it forms a high-impedance parallel resonant circuit, which in turn suppresses a current flow in the receive antenna. The PIN diodes employed as switches have the advantage that in the conducting state the PIN diodes are able to switch very high radiofrequency currents and in the non-conducting state introduce few losses into the receive antenna. The disadvantages are that in the conducting state relatively high direct currents flow through the PIN diode and that the transition to the non-conducting state is comparatively slow.

SUMMARY AND DESCRIPTION

The scope of the present invention is defined solely by the appended claims and is not affected to any degree by the statements within this summary. The present embodiments may obviate one or more of the drawbacks or limitations in the related art.

The object of the present embodiments is therefore to specify an arrangement for detuning with a reduced switching current strength.

An arrangement for detuning a receive antenna accordingly includes at least one receive antenna having at least one first capacitance, wherein radiofrequency signals from a magnetic resonance examination may be received by way of the receive antenna. The arrangement furthermore includes a switchable detuning circuit containing the first capacitance switched to form an oscillating circuit and a first inductance, and a switching device having a first and a second connection point in order to deliver a voltage between the first and a second connection point, and also one or more transistors. In this situation, the switching device is designed in order to switch the oscillating circuit to a high impedance level with the aid of the one or more transistors on delivery of, in particular, a positive voltage to the first connection point so as to prevent a radiofrequency signal from being received by way of the receive antenna.

The capacitance may be implemented in the form of an electrical capacitor and the inductance in the form of a coil. The frequency of the radiofrequency signal may lie in the range of 10 to 1000 MHz commonly used for MRT examinations.

By detuning the receive antenna, it is possible to avoid an undesired inductive coupling-in of strong currents that may be generated in the receive antenna by a received send signal into a possible patient body. With the aid of the detuning circuit, it is therefore possible to suppress the undesired receipt of the transmit signal by the receive antenna. To this end, the positive voltage is advantageously delivered to the first connection point during the send phases of the MRT examination, (e.g., an electrical voltage is applied between the first connection point as field point and the second connection point as reference point). The time intervals in which radiofrequency signals are radiated into the possible patient body by the magnetic resonance device in order to excite atomic nuclei may be regarded as send phases. Correspondingly, receive phases may be those time intervals in which magnetic resonance signals resulting from the excitation are received by the magnetic resonance device, in particular, with the aid of the receive antenna.

As a result of delivering different voltages, it is possible to place the switching device, and thereby also the detuning circuit, into different operating states. Advantageously in this situation, in a first possible operating state, for instance, if a positive voltage is applied during the send phases, the receipt of a radiofrequency signal by way of the receive antenna is prevented and in a second possible operating state. For instance, if a negative voltage is applied during the receive phases, the receipt of a radiofrequency signal by way of the receive antenna is enabled by, for example, switching the oscillating circuit to a low impedance level.

In contrast to the described prior art, transistors may now be used instead of PIN diodes in order to switch the operating states since PIN diodes enable an almost currentless control.

The switching device may have at least one diode, e.g., a Zener diode. A diode, (e.g., a Zener diode), may be employed in order to limit a voltage.

An embodiment provides that at least one of the one or more transistors is a field-effect transistor (FET) having a gate terminal, a source terminal, and a drain terminal, wherein the gate terminal is connected to the first connection point.

As a result of connecting the gate terminal to the first connection point, it is possible to deliver a voltage to the gate terminal, by which voltage the field-effect transistor may be switched. Field-effect transistors may advantageously be switched in current-less and/or lossless fashion to the greatest possible extent.

The field-effect transistor may be a metal-oxide-semiconductor field-effect transistor (MOSFET or MOS-FET). Metal-oxide-semiconductor field-effect transistors advantageously exhibit a good uptime, low production costs, and/or a high packing density. High switching speeds may moreover be achieved therewith.

Furthermore, the field-effect transistor may be a field-effect transistor based on III-V semiconductors, (e.g., a group III nitride). In certain examples, a field-effect transistor based on gallium nitride (GaN) is used as a field-effect transistor.

Field-effect transistors based on GaN advantageously exhibit a high ratio of current-carrying capacity to drain-source capacitance (Cds). If this were not the case, in other words, if the drain-source capacitance were too great in the case of a correspondingly high required current-carrying capacity over the drain-source path, in the actually non-conducting operating state a possible induced radiofrequency current may continue to flow significantly by way of the capacitance. Moreover, an inductive compensation may only be meaningful to a limited extent here since this may not be possible without introducing additional losses significantly impairing the noise factor in the receive process.

In the non-conducting operating state, no current or as little current as possible is able to flow over the drain-source path, that is it corresponds to the second possible operating state in which the oscillating circuit is deactivated, in other words is switched to a low impedance level. The first possible operating state accordingly corresponds to a conducting operating state in which the oscillating circuit is activated, in other words is switched to a high impedance level.

An embodiment provides that the switching device has a diode, (e.g., a Zener diode), which in the forward direction is connected to the gate terminal and the first connection point and also in the reverse direction to the source terminal (S). In other words, in this embodiment, the switching device has a connection between the source terminal and the gate terminal in the forward direction of the diode and furthermore it has a connection between the source terminal and the first connection point in the forward direction of the diode.

The diode is thereby able, in particular, when a negative voltage is delivered at the first connection point, to limit the voltage between the gate terminal and the source terminal, which means that the field-effect transistor remains non-conducting and the receive antenna remains resonant.

It is furthermore proposed that the switching device has a connection between the second connection point and the drain terminal.

With this type of circuit, a positive voltage may be attained between the drain terminal and the source terminal of the transistor in the non-conducting operating state, e.g., when negative voltage is applied at the first connection point. Since field-effect transistors may exhibit a decreasing drain-source capacitance as the drain-source voltage increases, the drain-source capacitance may thereby advantageously be reduced with the aid of the positive voltage between the drain terminal and the source terminal. This may enable a further enhancement of the receive characteristics of the receive antenna.

The field-effect transistor may exhibit a behavior analogous to an inverse diode.

In this variant, the structure of the source and drain terminals is therefore not symmetric in order to achieve a better behavior. With the behavior analogous to the inverse diode, it is possible to ensure that the field-effect transistor switches reliably.

A further embodiment provides that at least one of the one or more transistors is a bipolar transistor (e.g., bipolar junction transistor, BJT). The BJT enables the switching of high currents and/or voltages.

A further embodiment provides that at least one of the one or more transistors is a bipolar transistor with an insulated gate electrode (e.g., insulated-gate bipolar transistor, IGBT). The IGBT combines advantages of the bipolar transistor, in particular, a good forward conduction capability, a high reverse voltage and robustness, with advantages of a field-effect transistor, in particular, almost current-less control.

The terminals of a bipolar transistor may be referred to as base, collector, and emitter. The terminals of an IGBT may be referred to as gate, collector, and emitter. The terminals of a field-effect transistor may be referred to as gate, source, and drain.

In all three cases, it is possible by electrical manipulation at a first terminal, in particular, the application of voltage and/or current, to influence an electrical characteristic, in particular, a current flow, between the two other terminals. In other words, a switching operation may be performed. The first terminal in the case of a field-effect transistor and in the case of an IGBT may be the gate terminal. The first terminal in the case of a bipolar transistor may be the base terminal. The two other terminals in the case of a field-effect transistor may be the source terminal and the drain terminal. The two other terminals in the case of a bipolar transistor and an IGBT may be the collector terminal and the emitter terminal.

Accordingly, the embodiments described in detail in the foregoing for a field-effect transistor may also be applied to a bipolar transistor and an IGBT and also other transistor types.

In accordance with a further embodiment, the switching device has at least two transistors connected oppositely in series. A halving of the capacitance and a switch having large-signal immunity are thereby obtained.

An embodiment provides that the switching device has at least one resistance for current limiting. A further embodiment provides that the switching device has at least one inductance for current limiting and/or for filtering. In particular, the at least one inductance may act as an RF choke, or RF trap. In other words, it is thereby possible inter alia to limit radiofrequency currents and/or filter radiofrequency signals.

The at least one receive antenna may be designed as a loop antenna and/or dipole antenna because these are particularly suitable for receiving magnetic resonance signals. Loop antennas may also be referred to as magnetic field antenna and/or frame antenna. At higher magnetic field strengths, (e.g., 7 Tesla and greater), dipole antennas may be well suited for receiving magnetic resonance signals.

Furthermore, a magnetic resonance coil is proposed that includes a receive antenna, and a magnetic resonance device that includes at least one such magnetic resonance coil, wherein the magnetic resonance coil may in particular be a local coil.

The advantages thereof correspond to the advantages of the arrangement for detuning a receive antenna, which are explained above in detail. Features, advantages, or alternative embodiments mentioned here may likewise also be transferred to the other claimed subject matters and vice versa.

BRIEF DESCRIPTION OF THE DRAWINGS

Further advantages, features and details will emerge from the exemplary embodiments described in the following and with reference to the drawings. Parts corresponding to one another are identified by the same reference characters in the figures.

DETAILED DESCRIPTION

Figure 6:
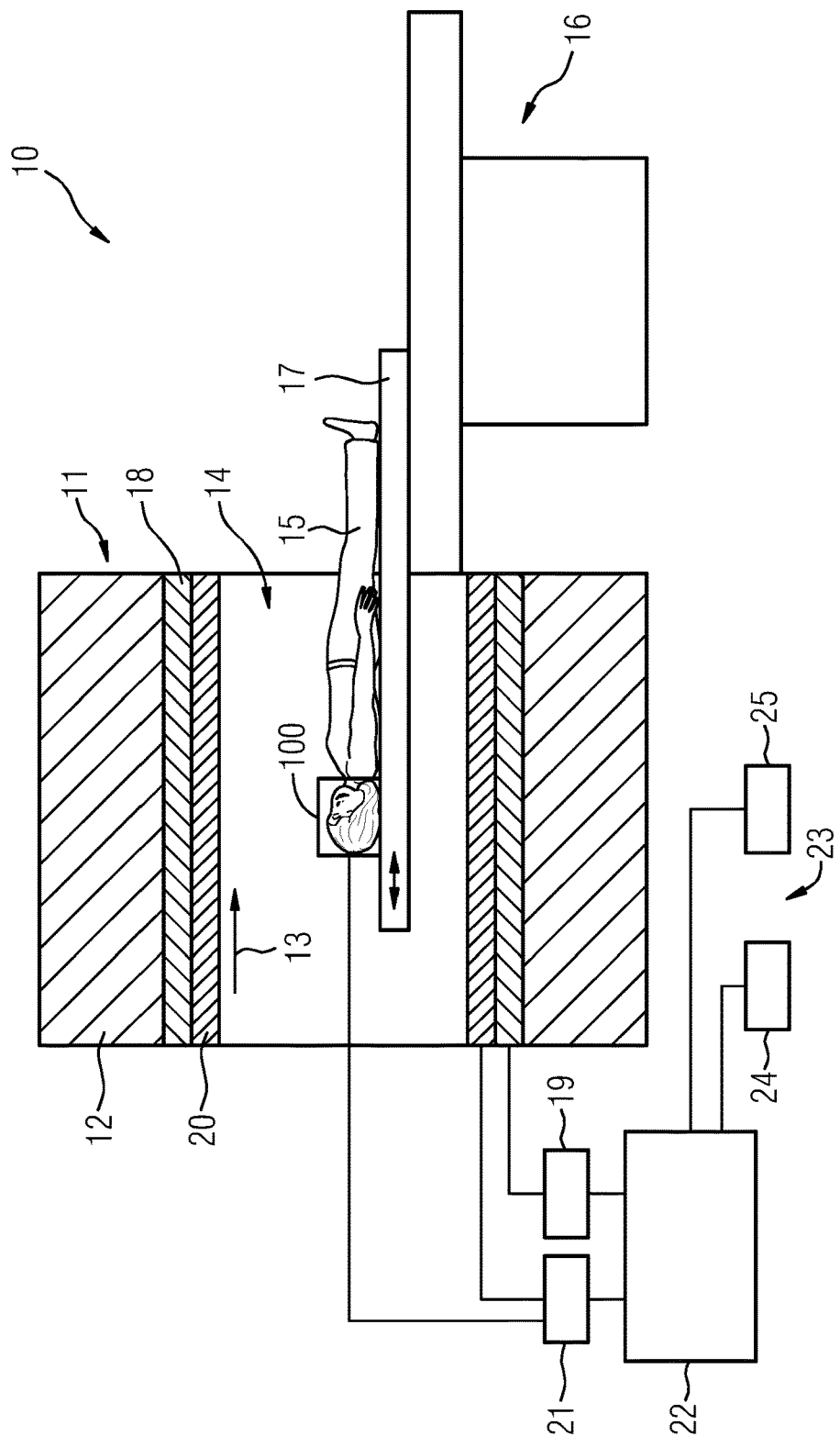
FIG. 6 depicts a schematic illustration of a magnetic resonance device, according to one example.

FIG. 6 schematically illustrates a magnetic resonance device 10. The magnetic resonance device 10 includes a magnet unit 11 having a superconducting main magnet 12 in order to generate a strong and, in particular, temporally constant main magnetic field 13. The magnetic resonance device 10 also has a patient receiving area 14 for receiving a patient 15. The patient receiving area 14 in the present exemplary embodiment is cylindrical in form and enclosed in cylindrical fashion in a circumferential direction by the magnet unit 11. In principle, a design of the patient receiving area 14 differing therefrom is however conceivable at any time. The patient 15 may be slid by a patient positioning device 16 of the magnetic resonance device 10 into the patient receiving area 14. To this end, the patient positioning device 16 has a patient examination table 17 designed to be capable of movement within the patient receiving area 14.

The magnet unit 11 furthermore has a gradient coil unit 18 in order to generate magnetic field gradients, which are used for position encoding during an imaging process. The gradient coil unit 18 is controlled by a gradient control unit 19 of the magnetic resonance device 10. The magnet unit 11 furthermore includes a radiofrequency antenna unit 20, which in the present exemplary embodiment is designed as a body coil fixedly integrated into the magnetic resonance device 10. The radiofrequency antenna unit 20 is designed in order to excite atomic nuclei, which excitation occurs in the main magnetic field 13 generated by the main magnet 12. The radiofrequency antenna unit 20 is controlled by a radiofrequency antenna control unit 21 of the magnetic resonance device 10 and radiates radiofrequency magnetic resonance sequences into an examination space that may be formed by a patient receiving area 14 of the magnetic resonance device 10. The radiofrequency antenna unit 20 is furthermore designed in order to receive magnetic resonance signals.

The magnetic resonance device 10 furthermore has a magnetic resonance coil 100 fitted locally on the patient 15 and may be controlled by the radiofrequency antenna control unit 21. In the same way as the radiofrequency antenna unit 20, the magnetic resonance coil 100 is designed in order to receive magnetic resonance signals. The sending of radiofrequency magnetic resonance sequences by the magnetic resonance coil 100 is also conceivable. The arrangement for detuning a receive antenna may be encompassed by the magnetic resonance coil 100. It is also conceivable that the arrangement is encompassed by the radiofrequency antenna unit 20.

In order to control the main magnet 12, the gradient control unit 19, and the radiofrequency antenna control unit 21, the magnetic resonance device 10 has a system control unit 22. The system control unit 22 provides central control for the magnetic resonance device 10, e.g., performing a predetermined imaging gradient echo sequence. In addition the system control unit 22 includes an evaluation unit, in order to evaluate medical image data acquired during the magnetic resonance examination. The magnetic resonance device 10 furthermore includes a user interface 23 connected to the system control unit 22. Control information such as for example imaging parameters, as well as reconstructed magnetic resonance images, may be displayed on a display unit 24, (e.g., on at least one monitor), of the user interface 23 for medical operating staff. The user interface 23 furthermore has an input unit 25, by which information and/or parameters may be entered by the medical operating staff during a measurement process.

The magnetic resonance device 10 presented in the present exemplary embodiment may include further components found within magnetic resonance devices. The functioning of a magnetic resonance device 10 is moreover known to the person skilled in the art so that a detailed description of certain components may be dispensed with.

Figure 1:
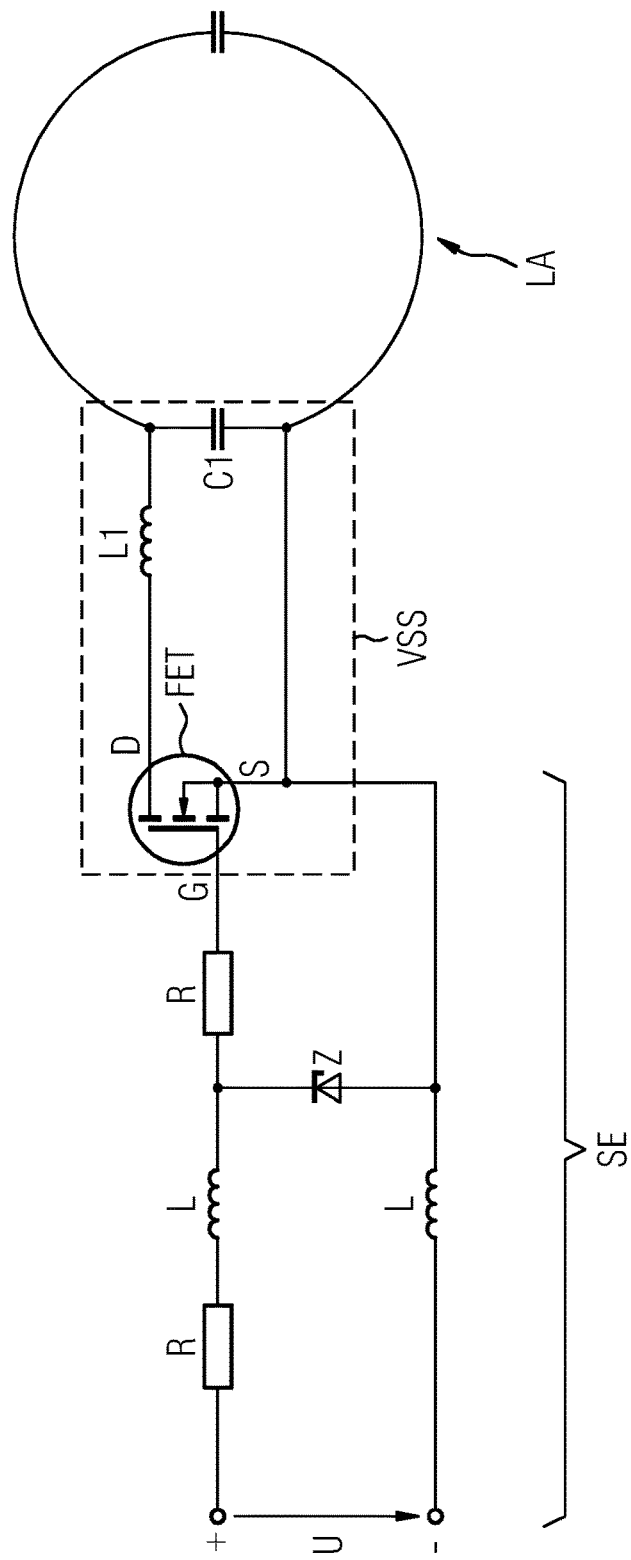
FIG. 1 depicts a schematic circuit diagram of a first example for detuning a receive antenna.

FIG. 1 depicts a schematic circuit diagram of a first arrangement for detuning a receive antenna LA, which is capable of receiving radiofrequency signals from a magnetic resonance examination. The receive antenna LA, which is designed here as a loop antenna, has a first capacitance C1 that may be designed as a capacitor.

The arrangement furthermore has a switchable detuning circuit VSS containing the first capacitance C1 switched to form an oscillating circuit and a first inductance L1. The detuning circuit may be switched with a transistor, in the example illustrated with a field-effect transistor FET, which is part of a switching device SE. The field-effect transistor FET has three terminals, namely a gate terminal G, a source terminal S and a drain terminal D. In addition, the switching device SE has a first connection point (+) and a second connection point (−) in order to deliver a voltage U, a plurality of resistances R and inductances L and also a diode Z. The diode Z, here a Zener diode, is connected in the forward direction to the gate terminal G and to the first connection point (+) and also in the reverse direction to the source terminal S. In addition, the gate terminal G of the field-effect transistor FET is connected to the first connection point (+). Furthermore, the switching device has resistances and inductances that may be employed for current limiting and/or for filtering.

If a positive voltage, (e.g., +10 V), is present between the first connection point (+) and the second connection point (−), then the field-effect transistor FET is conducting and the first inductance L1 together with the first capacitance C1 forms a high-impedance parallel oscillating circuit to the receive antenna LA, which suppresses the current flow in the receive antenna LA. In the case of a negative voltage between the first connection point (+) and the second connection point (−), (e.g., −30 V), the Zener diode Z limits the gate-source voltage of the field-effect transistor FET, (e.g., to −0.7 V). It then remains blocked and the receive antenna LA remains resonant. In other words, it may effectively receive magnetic resonance signals. The voltage between the drain terminal D and the source terminal S in this circuit is 0 V.

Figure 5:
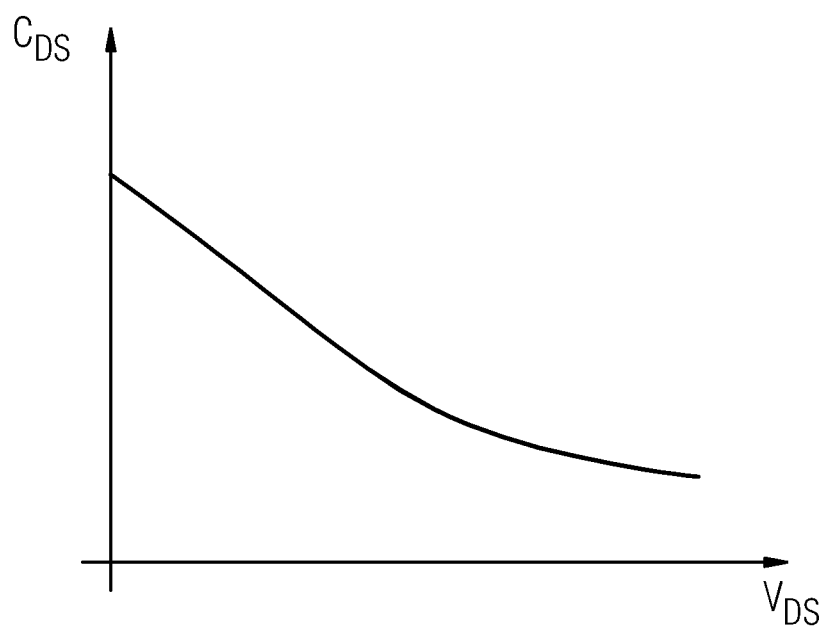
FIG. 5 depicts a diagram for a field-effect transistor that represents a drain-source capacitance as a function of a drain-source voltage, according to one example.

FIG. 5 illustrates, by way of example for a field-effect transistor, the curve of a drain-source capacitance $C_{DS}$ as a function of a drain-source voltage $V_{DS}$. The drain-source capacitance $C_{DS}$ is greatest at a drain-source voltage $V_{DS}$ of 0 V. Since the qualities of the drain-source capacitance $C_{DS}$ and of the coil L1 may be relatively low, losses are introduced into the circuit of the receive antenna LA in the non-conducting operating state. They may be characterized by an equivalent ohmic series resistance. It may be shown that the latter and thus also the losses rise slightly disproportionately with the drain-source capacitance $C_{DS}$. A small capacitance is therefore desirable with a view to achieving a low receiver noise figure.

Figure 2:
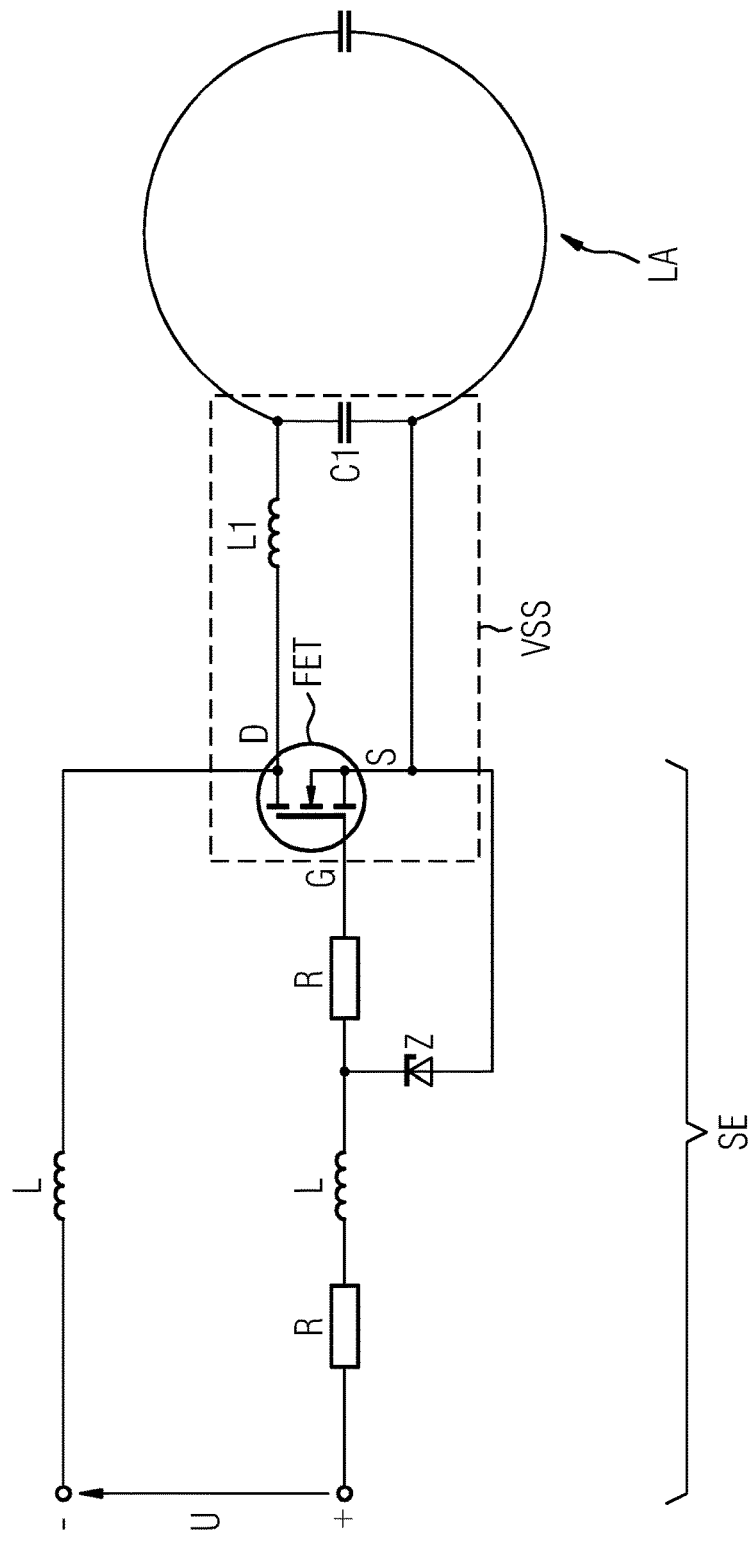
FIG. 2 depicts a schematic circuit diagram of a second example for detuning a receive antenna.

In the same way as the circuit in FIG. 1, the modified circuit in FIG. 2 depicts an arrangement for detuning a receive antenna LA, which is capable of receiving radiofrequency signals from a magnetic resonance examination. The receive antenna LA, which is also designed here as a loop antenna, has a first capacitance C1 that may be designed as a capacitor.

The arrangement furthermore has a switchable detuning circuit VSS that contains the first capacitance C1 switched to form an oscillating circuit and a first inductance L1. Said detuning circuit may be switched with a transistor, in the example illustrated with a field-effect transistor FET, which is part of a switching device SE. The field-effect transistor FET has three terminals, namely a gate terminal G, a source terminal S and a drain terminal D. In addition the switching device SE has a first connection point + and a second connection point − in order to deliver a voltage U, a plurality of resistances R and inductances L and also a diode Z. The diode Z, here a Zener diode, is connected in the forward direction to the gate terminal G and to the first connection point + and also in the reverse direction to the source terminal S. In addition the gate terminal G of the field-effect transistor FET is connected to the first connection point +. Furthermore, the switching device has resistances and inductances that may be employed for current limiting and/or for filtering.

With the modified circuit in FIG. 2, in which the switching device SE has a connection between the second connection point (−) and the drain terminal D, with identical control and without additional components, it is possible to achieve a positive voltage between the drain terminal D and the source terminal S of the field-effect transistor FET and thereby a considerably reduced drain-source capacitance.

Figure 3:
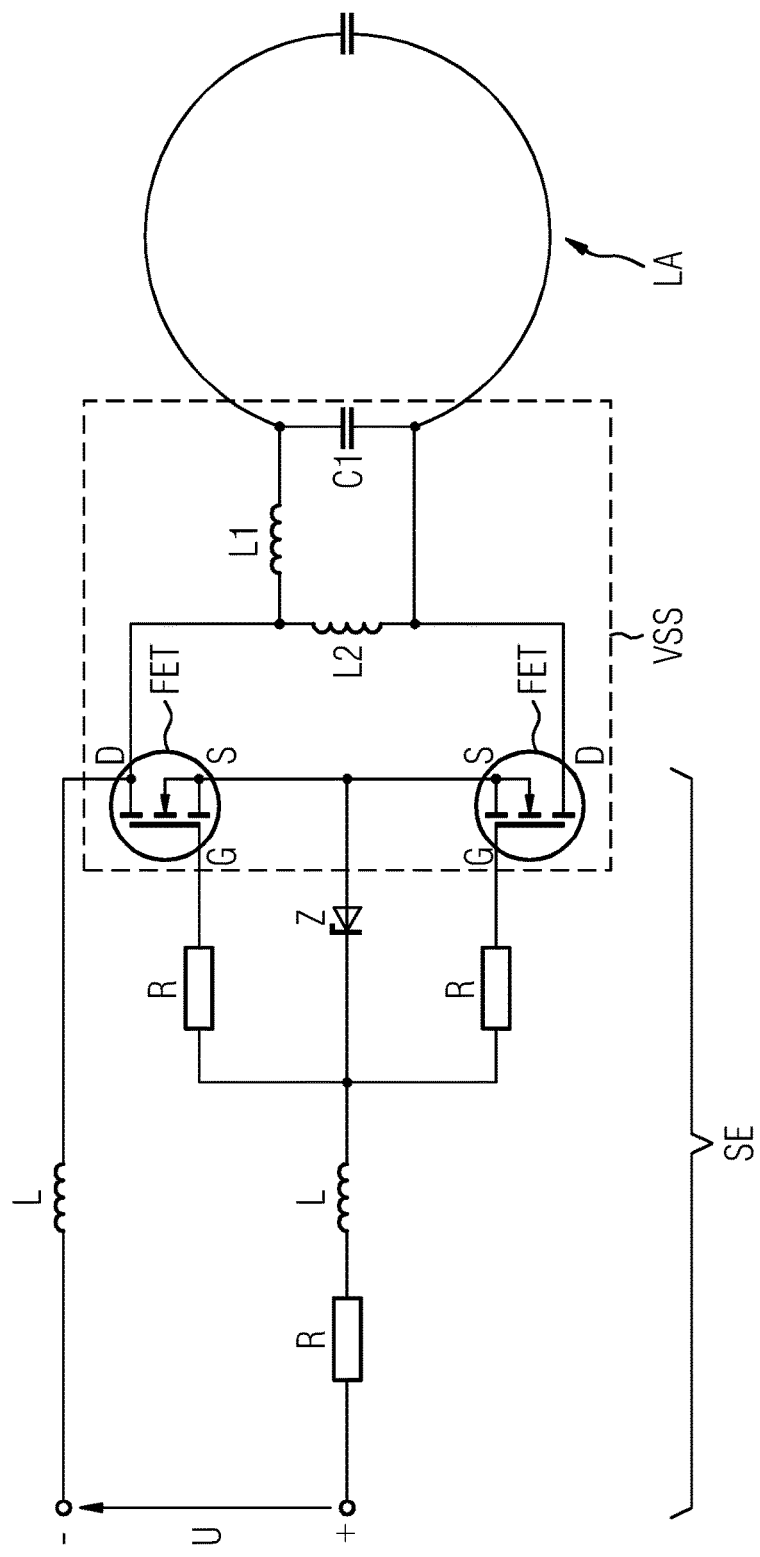
FIG. 3 depicts a schematic circuit diagram of a third example for detuning a receive antenna.
Figure 4:
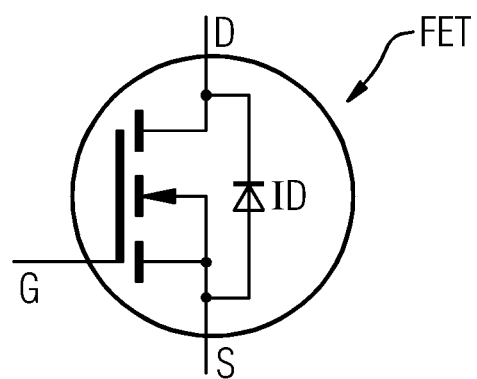
FIG. 4 depicts a schematic circuit diagram of a field-effect transistor with an inverse diode, according to one example.

The field-effect transistor FET advantageously exhibits a behavior analogous to an inverse diode ID, as is illustrated in FIG. 4. This means that, in the circuits as they are illustrated in FIGS. 2 and 3, the fact may be utilized that a reverse current is enabled from source S to drain D. In the case of a positive voltage between the first connection point (+) and the second connection point (−) of for example +10 V a small current, limited by a dropping resistor R, flows by way of the Zener diode and by way of the intrinsic diode ID of the field-effect transistor FET. This results in a sufficiently high gate-source voltage in order to transfer the field-effect transistor FET into a conducting operating state. In the case of a negative voltage between the first connection point (+) and the second connection point (−) of for example −30 V on the other hand, the field-effect transistor FET blocks, gate G, and source S are at the same electrical potential and the voltage drops completely across the drain-source path. The capacitance having an external effect is in this case thereby considerably smaller than in the case of the circuit illustrated in FIG. 1.

A further halving of the source-drain capacitance and also a switch having large-signal immunity are obtained with the variant, illustrated FIG. 3. In this variant, two field-effect transistors FET are connected oppositely in series. The mode of operation is analogous to the unipolar variant from FIG. 2. In particular, an inductance L2 is used as a DC feed for the drain terminal not directly connected to the second connection point (−). Furthermore, the inductance L2 may be chosen in such a manner that the remaining parasitic capacitance of the series connection of the field-effect transistors FET is compensated for herewith.

In summary, it may be said for the arrangement for detuning a receive antenna LA illustrated in FIGS. 2 and 3 that by controlling between gate G and drain D the drain-source voltage $V_{DS}$ may be increased in a simple manner in the non-conducting case and the source-drain capacitance $C_{SD}$ may thereby be reduced. As a result of the reduced capacitance, the losses may be considerably reduced in the receive case. As in the case of the circuit illustrated in FIG. 1, the control is effected in almost current-less fashion. The circuit may be operated using conventional control signals for PIN diodes (e.g., +10 V/−30 V), meaning that it is suitable as a substitute, controlled in current-less fashion, for PIN diodes. The variant having two field-effect transistors (FET) illustrated in FIG. 3 results in a further reduction of the losses.

The field-effect transistor FET may be designed as a metal-oxide-semiconductor field-effect transistor. Furthermore, it may be a field-effect transistor based on III-V semiconductors. In particular, field-effect transistors based on gallium nitride (GaN) advantageously exhibit a relatively low drain-source capacitance at a given current-carrying capacity. With reference to the diagram illustrated in FIG. 5, this means that the $C_{DS}$ curves of field-effect transistors based on many other materials have considerably higher values.

It is however also possible to employ other transistor types such as for example bipolar transistors and/or bipolar transistors with an insulated gate electrode (IGBT) in analogously constructed circuits for detuning a receive antenna.

Finally, it may be noted once again that methods described in detail in the foregoing and also the magnetic resonance device presented are only exemplary embodiments that may be modified in many different ways by the person skilled in the art without departing from the scope of the invention. Furthermore, use of the indefinite article "a" or "an" does not mean that the features in question cannot also be present several times.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. An arrangement for detuning a receive antenna, the arrangement comprising:
    a receive antenna having at least one first capacitance, wherein radiofrequency signals from a magnetic resonance examination are receivable by way of the receive antenna;
    a switchable detuning circuit that contains the at least one first capacitance switched to form an oscillating circuit and a first inductance; and a switching device comprising one or more transistors, a first connection point, and a second connection point configured to deliver a voltage between the first connection point and the second connection point, wherein at least one transistor of the one or more transistors is a field-effect transistor having a gate terminal, a source terminal, and a drain terminal, and wherein the gate terminal is connected to the first connection point, wherein the switching device is configured to switch the oscillating circuit to a high impedance level with aid of the one or more transistors on delivery of a positive voltage to the first connection point so as to prevent a radiofrequency signal from being received by way of the receive antenna.

2. The arrangement of claim 1, wherein the switching device further comprises at least one diode.

3. The arrangement of claim 1, wherein the field-effect transistor is a metal-oxide-semiconductor field-effect transistor.

4. The arrangement of claim 1, wherein the field-effect transistor is a field-effect transistor based on III-V semiconductors.

5. The arrangement of claim 1, wherein the field-effect transistor is a field-effect transistor based on gallium nitride.

6. The arrangement of claim 1, wherein the switching device has a diode connected to the gate terminal and the first connection point in a forward direction, and connected to the source terminal in a reverse direction.

7. The arrangement of claim 1, wherein the switching device has a connection between the second connection point and the drain terminal.

8. The arrangement of claim 1, wherein the field-effect transistor exhibits a behavior analogous to an inverse diode.

9. The arrangement of claim 1, wherein at least one transistor of the one or more transistors is a bipolar transistor.

10. The arrangement of claim 9, wherein the bipolar transistor comprises an insulated gate electrode.

11. The arrangement of claim 1, wherein the switching device comprises at least two transistors connected in series.

12. The arrangement of claim 1, wherein the switching device comprises at least one resistance for current limiting.

13. The arrangement of claim 1, wherein the switching device comprises at least one inductance for current limiting and/or for filtering.

14. The arrangement of claim 1, wherein the receive antenna is a loop antenna and/or dipole antenna.

15. A magnetic resonance coil comprising:
an arrangement for detuning a receive antenna, the arrangement comprising:
a receive antenna having at least one first capacitance, wherein radiofrequency signals from a magnetic resonance examination are receivable by way of the receive antenna;
a switchable detuning circuit that contains the at least one first capacitance switched to form an oscillating circuit and a first inductance; and
a switching device comprising one or more transistors, a first connection point, and a second connection point configured to deliver a voltage between the first connection point and the second connection point, wherein at least one transistor of the one or more transistors is a field-effect transistor having a gate terminal, a source terminal, and a drain terminal, and wherein the gate terminal is connected to the first connection point, wherein the switching device is configured to switch the oscillating circuit to a high impedance level with aid of the one or more transistors on delivery of a positive voltage to the first connection point so as to prevent a radiofrequency signal from being received by way of the receive antenna.

16. The magnetic resonance coil of claim 15, wherein the magnetic resonance coil is a local coil.

17. A magnetic resonance device comprising:
at least one magnetic resonance coil, the magnetic resonance coil comprising:
an arrangement for detuning a receive antenna, the arrangement comprising:
a receive antenna having at least one first capacitance, wherein radiofrequency signals from a magnetic resonance examination are receivable by way of the receive antenna;
a switchable detuning circuit that contains the at least one first capacitance switched to form an oscillating circuit and a first inductance; and
a switching device comprising one or more transistors, a first connection point, and a second connection point configured to deliver a voltage between the first connection point and the second connection point, wherein at least one transistor of the one or more transistors is a field-effect transistor having a gate terminal, a source terminal, and a drain terminal, and wherein the gate terminal is connected to the first connection point, wherein the switching device is configured to switch the oscillating circuit to a high impedance level with aid of the one or more transistors on delivery of a positive voltage to the first connection point so as to prevent a radiofrequency signal from being received by way of the receive antenna.

18. The magnetic resonance device of claim 17, wherein the at least one magnetic resonance coil is a local coil.

* * * * *